(12) United States Patent
Lee

(10) Patent No.: US 6,333,663 B1
(45) Date of Patent: Dec. 25, 2001

(54) HIGH VOLTAGE TOLERANT INTERFACE CIRCUIT

(75) Inventor: Jae-yup Lee, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/518,142

(22) Filed: Mar. 3, 2000

(30) Foreign Application Priority Data

Mar. 4, 1999 (KR) .................................................. 99-7117

(51) Int. Cl.[7] .......................... G11C 7/10; H03K 19/0185; G05F 1/571
(52) U.S. Cl. .......................... 327/333; 327/541; 327/543; 326/81; 365/189.09
(58) Field of Search ..................................... 327/333, 530, 327/185, 538, 540, 541, 543; 326/80, 81, 83, 33, 56, 57, 58; 365/189.05, 189.09, 226; 361/91

(56) References Cited

U.S. PATENT DOCUMENTS

| 5,266,849 | * 11/1993 | Kitahara et al. ........................ 326/62 |
| 5,418,476 | 5/1995 | Strauss .................................... 326/81 |
| 5,450,025 | 9/1995 | Shay ....................................... 326/81 |
| 5,623,447 | * 4/1997 | Shimoda .......................... 365/189.05 |
| 5,933,025 | * 8/1999 | Nance et al. ............................ 326/81 |
| 6,222,387 | * 4/2001 | Meng et al. ............................ 326/83 |

OTHER PUBLICATIONS

Makoto Takahashi et al. "3.3V–5V Compatible I/O Circuit without Thick Gate Oxide"; IEEE 1992; pp. 1–4.

* cited by examiner

Primary Examiner—Timothy P. Callahan
Assistant Examiner—Terry L. Englund
(74) Attorney, Agent, or Firm—Volentine Francos, PLLC

(57) ABSTRACT

A high-voltage tolerant interface circuit includes a terminal, first and second buffers, and a voltage controller. The first buffer includes MOS transistors having electrodes connected to the terminal, and converts and transfers the voltage level of an input signal to the terminal. The second buffer includes at least one MOS transistor having an electrode connected to the terminal, and converts a voltage level of a signal from the terminal. The voltage controller is connected to the terminal, and when a supply voltage is applied to the interface circuit, the voltage controller supplies the supply voltage to gates of the MOS transistors. When the supply voltage is not applied to the interface circuit and a voltage greater than the supply voltage is input to the terminal, the voltage controller pulls down the voltage and provides it to the gates of the MOS transistors.

15 Claims, 2 Drawing Sheets

HIGH VOLTAGE TOLERANT INTERFACE CIRCUIT

This application relies for priority upon Korean Patent Application No. 99-7117, filed on Mar. 4, 1999, the contents of which are herein incorporated by reference in their entirety.

BACKGROUND OF THE INVENTION

The present invention relates to semiconductor memory devices. More particularly, the present invention relates to a high-voltage tolerant interface circuit.

Through the use of a deep-submicron line width in the processing of semiconductor memory devices, a required power supply voltage as high as 3.3V has gradually been decreased to a lower voltage of approximately 2.5V. Most semiconductor memory devices include a plurality of input/output buffers, which operate to buffer data input with such a low power voltage.

Although the power supply voltage level applied to the input/output buffers has decreased, an external high-voltage signal of 5V can also be input to these input/output buffers. As a result, the input/output buffers must have the ability to tolerate a high-voltage of 5V for interfacing with an external 5V-input signal. These 5V-tolerant semiconductor memory devices are commonly used in low-power consumption devices and portable device applications.

However, conventional 5V-tolerant input/output buffers are effective only when an external power voltage is input. In order to protect metal oxide semiconductor (MOS) transistors included in the input/output buffers, it is necessary for the device to have the ability to tolerate voltage levels as high as 5V, even when no external power supply voltage is applied to a semiconductor memory device.

In general, the gates of NMOS and PMOS transistors of the input/output buffers operating with a low power supply voltage are formed having a thin dielectric film, e.g., a thin oxide film, with a low tolerant voltage level. In such a device, if a 5V-signal is applied to the drain or source of the NMOS and PMOS transistors, without the power supply voltage being applied to the gates of the NMOS and PMOS transistor, the gate-source voltage or the gate-drain voltage of the NMOS and PMOS transistors may increase and exceed the tolerable voltage limit of the gates of the NMOS and PMOS transistors. If this happens, the gates of the NMOS and PMOS transistors may b e broken, resulting in improper operation of the device.

SUMMARY OF THE INVENTION

To solve the above problems, it is an object of the present invention to provide a high-voltage tolerant interface circuit that is able to tolerate an external high-voltage of 5V or more even when no power supply voltage is applied.

Another object of the present invention is to provide a semiconductor memory device having a high-voltage tolerant interface circuit that is able to tolerate an external high-voltage of 5V or more unaffected regardless of application of the power supply voltage.

To achieve the first object of the present invention, a high-voltage tolerant interface circuit is provided. This circuit comprises a terminal; a first buffer including a plurality of MOS transistors with first electrodes connected to the terminal, for converting the voltage level of an input signal and transferring the converted voltage to the terminal; a second buffer including at least one MOS transistor with a first electrode connected to the terminal, for converting the voltage level of the signal transferred from the terminal; and a voltage control unit connected to the terminal for providing an internal supply voltage to the MOS transistors of the first and second buffers, wherein the internal power supply voltage is equal to an external power supply voltage when the external power supply voltage is applied to the high-voltage tolerant interface circuit, and wherein the internal power supply voltage is equal to a predetermined voltage level when the external power supply voltage is not applied to the high-voltage tolerant interface circuit and a high-voltage greater than the external power supply voltage is input to the terminal. The predetermined voltage level is preferably higher than 2 volts.

The internal power supply voltage is preferably set to the predetermined voltage level by pulling down the high-voltage input at the terminal to the predetermined voltage level. The voltage control unit preferably comprises a voltage pull-down circuit for pulling down the high-voltage to the predetermined voltage level. The voltage pull-down circuit preferably comprises a plurality of diodes arranged in series and connected with the terminal.

The voltage control unit preferably comprises: a switching control unit for receiving a first control signal and outputting second and third control signals, the first control signal instructing the switching control unit to enable the second control signal when the external power supply voltage is applied, and the first control signal instructing the switching control unit to enable the third control signal when the high-voltage is input to the terminal without the application of the external power supply signal; a first switch for passing the external power supply voltage as the internal power supply voltage in response to the enabling of the second control signal; and a second switch for passing the predetermined voltage pulled down by the voltage pull-down circuit as the internal power supply voltage in response to the enabling of the third control signal, wherein the voltage control unit outputs the internal power supply voltage at a node located between the first and second switches. The voltage control unit may further comprise a voltage discharge circuit for discharging a portion of the high-voltage to reduce it to the predetermined voltage level.

The high-voltage may be a voltage associated with a transistor-transistor logic (TTL) level.

"To achieve the second object of the present invention, a semiconductor memory device having an internal circuit is provided. This semiconductor memory device comprises a pad to and from which an external signal is input and output; an output buffer having a plurality of MOS transistors with first electrodes connected to the pad, for changing a voltage level of data output from the internal circuit, and transferring the converted voltage to the pad; an input buffer having at least one MOS transistor with a first electrode connected to the pad, for converting the voltage level of data input to the pad from an outside source, and transferring the converted voltage to the internal circuit; and a voltage control unit connected to the pad, for providing an internal supply voltage to the MOS transistors of the first and second buffers, wherein the internal power supply voltage is equal to an external power supply voltage when the external power supply voltage is applied to the high-voltage tolerant interface circuit, and wherein the internal power supply voltage is equal to a predetermined voltage level when the external power supply voltage is not applied to the high-voltage tolerant interface circuit and a high-voltage of magnitude greater than the external power supply voltage is input to the pad."

"The internal power supply voltage is preferably set to the predetermined voltage level by pulling down the high-voltage input at the pad to the predetermined voltage level. The voltage control unit preferably comprises a voltage pull-down circuit for pulling down the high-voltage."

The voltage control unit may also comprise: a switching control unit for receiving a first control signal and outputting second and third control signals, the first control signal instructing the switching control unit to enable the second control signal when the external power supply voltage is applied, and the first control signal instructing the switching control unit to enable the third control signal when the high-voltage is input to the terminal without the application of the external power supply signal; a first switch for passing the external power supply voltage in response to the enabling of the second control signal; and a second switch for passing the predetermined voltage in response to the enabling of the third control signal, wherein the voltage control unit outputs the internal power supply voltage at a node located between the first and second switches.

The voltage control unit may further comprise a voltage discharge circuit for discharging a portion of the high-voltage to reduce it to the predetermined voltage level.

"PMOS transistors among the plurality of MOS transistors in the output buffer may have N-wells connected to the high-voltage. And NMOS transistors among the plurality of MOS transistors in the output buffer may have P-wells coupled to a ground voltage."

The high-voltage tolerant interface circuit according to the present invention can tolerate an externally applied high-voltage having a magnitude greater than the power supply voltage both when the power supply voltage is applied and when the power supply voltage is not applied.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENT

Figure 1:
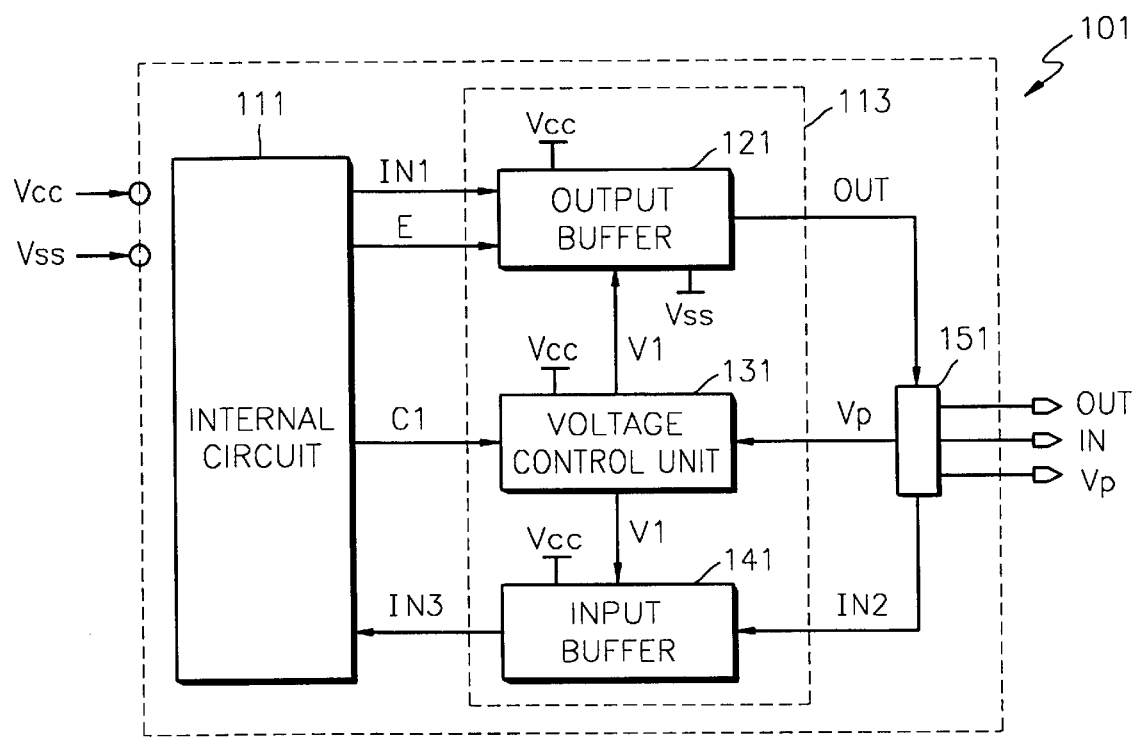
FIG. 1 is a block diagram of a semiconductor memory device having a high-voltage tolerant interface circuit according to a preferred embodiment of the present invention.

The present invention will now be described more fully with reference to the accompanying drawings, in which a preferred embodiment is shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. It is also noted that like reference numerals will be used to designate identical or corresponding parts throughout the several views.

FIG. 1 shows a semiconductor memory device having a high-voltage tolerant interface circuit according to a preferred embodiment of the present invention. As shown in FIG. 1, a semiconductor memory device 101 includes an internal circuit 111, a pad 151, and a high-voltage tolerant interface circuit 113. Preferably, the high-voltage tolerant interface circuit 113 includes an output buffer 121, a voltage control unit 131, and an input buffer 141. The output buffer 121, the input buffer 141, and the voltage control unit 131 are connected between the pad 151 and the internal circuit 111.

The output buffer 121 transfers a signal received from the internal circuit 111 to the pad 151. The input buffer 141 transfers a signal applied from the pad 151 to the internal circuit 111. The pad 151 is also referred to as a "terminal."

"When an external power supply voltage $V_{cc}$ is applied to the semiconductor memory device 101, the voltage control unit 131 supplies the power voltage $V_{cc}$ to the output buffer 121 and the input buffer 141 as voltage $V_1$. When a high-voltage $V_p$ of magnitude greater than the power voltage $V_{cc}$, e.g., a voltage of transistor-transistor logic (TTL) level, is applied to the pad 151, and the external power supply voltage $V_{cc}$ is not applied to the semiconductor memory device 101, the voltage control unit 131 pulls down the high-voltage $V_p$ to a first predetermined voltage $V_a$, for example, to 2–3V, and in turn provides the first predetermined voltage $V_a$ to the output buffer 121 and the input buffer 141 as voltage $V_1$."

Figure 2:
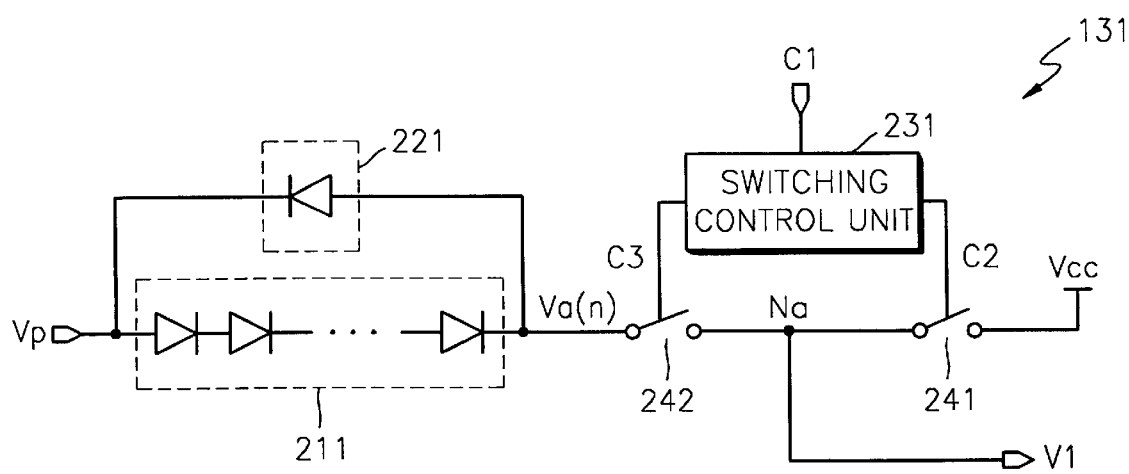
FIG. 2 is a circuit diagram of the voltage control unit of FIG. 1.

A circuit diagram of the voltage control unit 131 is shown in FIG. 2. Referring to FIG. 2, the voltage control unit 131 includes a voltage pull-down circuit 211, a voltage discharge circuit 221, a switching control unit 231, a first switch 241, and a second switch 242.

The voltage pull-down circuit 211 pulls down the high-voltage $V_p$, having a magnitude of, e.g., 5V, which is received through the pad 151 from an outside source, to the first predetermined voltage. The voltage pull-down circuit 211 preferably includes a plurality of serially-connected diodes capable of pulling down the high-voltage $V_p$. The anode of one end of the serially connected diodes, which each face in the same direction, is connected to the pad 151, so that each of the serially connected diodes is forward biased. Preferably, the diodes are junction diodes or MOS diodes. The MOS diodes are particularly advantageous in view of their smaller size and effective voltage dropping capacity with a small number of diodes. However, the diodes can be constructed in many other ways.

When the high-voltage $V_p$ input to the pad 151 is greater than a second predetermined voltage, e.g., if it is as high as 7V, the voltage discharge circuit 221 discharges the high-voltage $V_p$ to clamp the voltage level output from the voltage pull-down circuit 211 at the second predetermined voltage. The voltage discharge circuit 221 includes a diode, the cathode of which is connected to the pad 151. The diode may be replaced with various types of diodes as in the voltage pull-down circuit 211.

The switching control unit 231 receives a first control signal $C_1$ from the internal circuit 111 and outputs second and third control signals $C_2$ and $C_3$. When the external power supply voltage $V_{cc}$ is applied to the semiconductor memory device 101, the switching control unit 231 enables the second control signal $C_2$ to logic high. When the high-voltage $V_p$ is input to the pad 151 and the external power supply voltage $V_{cc}$ is not applied to the semiconductor memory device 101, the switching control unit 231 enables the third control signal $C_3$ to logic high.

The first switch 241 passes the external power voltage $V_{cc}$ as an internal power voltage $V_1$, in response to the second control signal $C_2$. In other words, when the second control signal $C_2$ is enabled to logic high, the first switch 241 is turned on, allowing for the power supply voltage $V_{cc}$ to pass through a node $N_a$, and be output as the internal power signal $V_1$. Likewise, when the second signal $C_2$ is disabled to logic low, the first switch 241 is turned off, which interrupts the transfer of the power supply voltage $V_{cc}$ to the node $N_a$. The first and second switches 241 and 242 may be replaced with a logic circuit or transmission gate.

The second switch 242 passes the voltage $N_a$ as an internal power voltage $V_1$, in response to the third control signal $C_3$. In other words, when the third control signal $C_3$ is enabled to logic high, the second switch 242 is turned on, allowing for the voltage $N_a$ to pass through a node $N_a$, and be output as the internal power signal $V_1$. Likewise, when the third control signal $C_3$ is disabled to logic low, the second switch 242 is turned off, which interrupts the transfer of the voltage $N_a$ to the node $N_a$.

In alternate embodiments, the first and second switches 241 and 242 may be replaced with a logic circuit or transmission gate.

In response to an output enable signal E, the output buffer 121 of the voltage tolerant interface circuit 113 converts the voltage level of data $IN_1$ output from the internal circuit 111 to a voltage level appropriate for an external system connected to the pad 151. For example, the output buffer 121 may convert a signal of a complementary metal oxide semiconductor (CMOS) voltage level into a signal of TTL voltage level. When the output enable signal E is enabled to logic high, the output buffer 121 is activated to invert and output the data $IN_1$. When the output enable signal E is disabled to logic low, the output buffer 121 is deactivated, placing the pad 151 into a high impedance state. In other words, when the output enable signal E is enabled and the data $IN_1$ is logic high, the output buffer 121 outputs a low voltage level. When the output enable signal E is still enabled and the data $IN_1$ goes low, the output buffer 121 outputs a high voltage level. It is appreciated to those skilled in the art that the output buffer 121 can be configured such that the output buffer 121 outputs a high voltage level when the data $IN_1$ is high, and outputs a low voltage level when the data $IN_1$ goes low.

Figure 3:
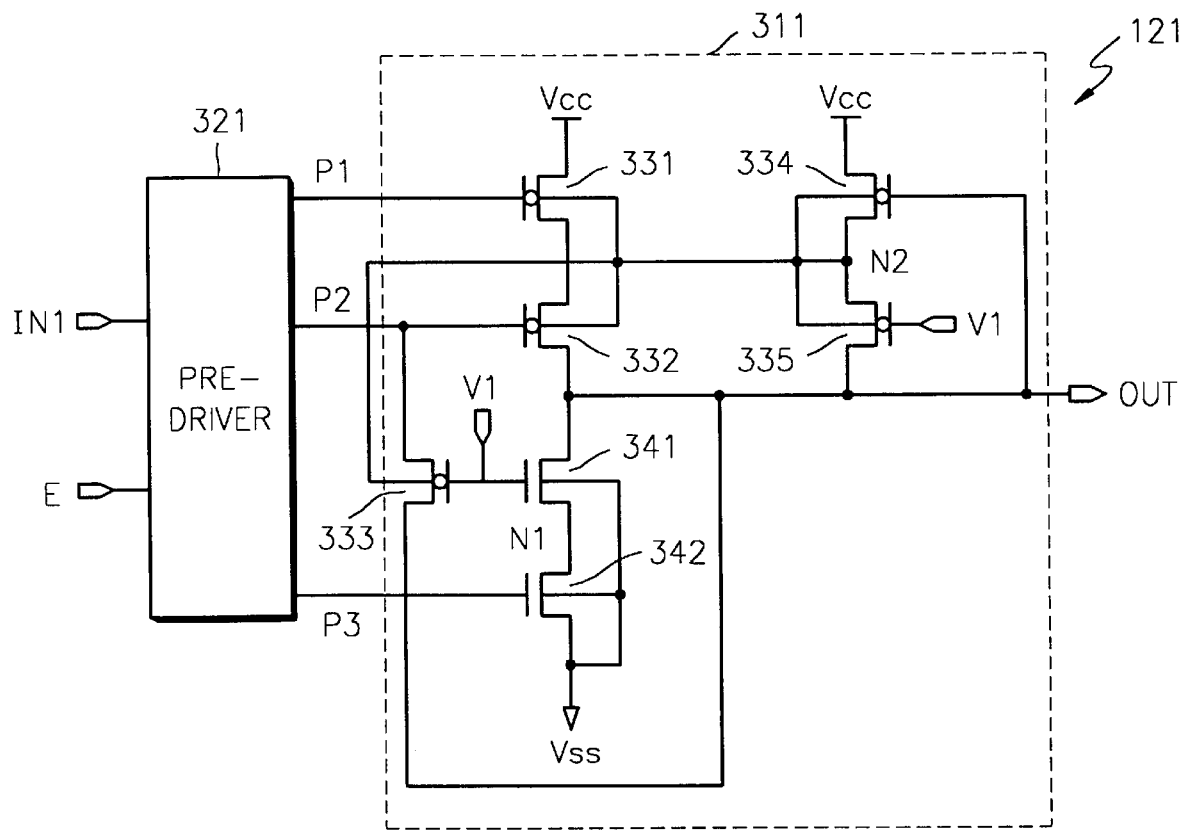
FIG. 3 is a circuit diagram of the output buffer of FIG. 1.

A circuit diagram of the output buffer 121 is shown in FIG. 3. Referring to FIG. 3, the output buffer 121 includes a pre-driver 321 and an buffering portion 311. The pre-driver 321 receives the output enable signal E and the data $IN_1$ from the internal circuit 111 and outputs first through third control signals $P_1$ through $P_3$. When the output enable signal E is disabled to logic low, the pre-driver 321 turns the buffering portion 311 off with the first through third control signals $P_1$ through $P_3$. When the output enable signal E is enabled to logic high, the pre-driver 321 turns the buffering portion 311 on with the first through third control signals $P_1$ through $P_3$. The truth values of the first through third control signals $P_1$ through $P_3$ according to logic levels of the output enable signal E and the data $IN_1$ are shown in Table 1.

TABLE 1

| Output enable signal (E) | Data ($IN_1$) | First control signal ($P_1$) | Second control signal ($P_2$) | Third control signal ($P_3$) |
| --- | --- | --- | --- | --- |
| L | — | H | H | L |
| H | H | H | H | H |
| H | L | L | L | L |

As shown in Table 1, when the output enable signal E is low, the first and second control signals $P_1$ and $P_2$ are asserted to logic high and the third control signal $P_3$ is disabled to logic low. When the output enable signal E is logic high, the voltage level of the first through third control signals $P_1$ through $P_3$ depends on the voltage level of the data $IN_1$. In other words, when the output enable signal E is logic high and the data $IN_1$ is logic high, the first through third control signals $P_1$ through $P_3$ are asserted to be logic high. When the output enable signal E is logic high and the data $IN_1$ is logic low, the first through third control signals $P_1$ through $P_3$ are disabled to be logic low. It is obvious to those skilled in the art that the pre-driver 321 can be implemented with a logic circuit using Table 1 to describe its operation.

The buffering portion 311 outputs an output signal OUT of the semiconductor memory device 101 in response to the first through third control signals $P_1$ through $P_3$. The buffering portion 311 includes NMOS transistors 341 and 342, and PMOS transistors 331 through 335. The NMOS transistors 341 and 342 and the PMOS transistors 331 and 332 substantially form an inverter. Since the internal power supply voltage $V_1$ is applied to the gate of the NMOS transistor 341, the NMOS transistor 341 is always maintained in an ON state while the external power voltage $V_{cc}$ is applied to the semiconductor memory device 101.

When the first through third control signals $P_1$ through $P_3$ are logic high, the PMOS transistors 331 and 332 are turned off and the NMOS transistor 342 is turned on. As such, the output signal OUT of the semiconductor memory device 101 is pulled to ground voltage level, i.e., logic low. Furthermore, when all of the first through third control signals $P_1$, $P_2$ and $P_3$ go low, the NMOS transistor 342 is turned off and the PMOS transistors 331 and 332 are turned on, pulling the output signal OUT to the power supply voltage $V_{cc}$, i.e., logic high.

In the state where the output signal OUT is logic high, the output signal OUT reaches 3.3V when the power supply voltage $V_{cc}$ of 3.3V is applied, and the output signal OUT reaches 5V when the power supply voltage $V_{cc}$ of 5V is applied. In other words, the voltage level of the output signal OUT is defined by the level of the power supply voltage $V_{cc}$ applied to the output buffer 121. In doing so, the output buffer 121 converts the voltage level of the data $IN_1$ received from the internal circuit 111 to a voltage level appropriate for an external system connected to the pad 151.

With the decrease in the level of the power supply voltage $V_{cc}$, the size of the PMOS transistors 331 through 335 and the NMOS transistors 341 and 342 has gradually decreased, lowering the tolerable range of the gate-source or gate-drain voltage of the PMOS transistors 331 through 335 and the NMOS transistors 341 and 342. Accordingly, a high-voltage $V_p$ applied to the drain or source of the PMOS transistors 331 through 335 and the NMOS transistors 341 and 342 may breakdown the PMOS transistors 331 through 335 and the NMOS transistors 341 and 342. However, the buffering portion 311 according to the present invention can be protected from the high-voltage $V_p$ when no external power voltage $V_{cc}$ is applied as well as when the external power voltage $V_{cc}$ is applied.

First, when the external power supply voltage $V_{cc}$ is applied to the semiconductor memory device 101, the NMOS transistor 341 receives the external power supply voltage $V_{cc}$ (as an internal power supply voltage $V_1$) at its gate. Thus, although the high-voltage $V_p$ is applied to the pad 151, the voltage on the node $N_1$ never exceeds ($V_{cc}-V_t$), protecting the NMOS transistor 342 from the high-voltage $V_p$. Here, $V_t$ represents the threshold voltage of the NMOS transistor 341. When a low voltage is applied to the gate of the NMOS transistor 342, the NMOS transistor 342 is turned off and the drain-source voltage of the NMOS transistor 342 is pulled to ($V_{cc}-V_t$), again protecting the NMOS transistor 342 from the high-voltage $V_p$. Thus, the NMOS transistor 341 acts as a shield for the NMOS transistor 342.

When the high-voltage $V_p$ is applied to the pad 151, the high voltage $V_p$ is applied through the PMOS transistor 333 to the gate of the PMOS transistor 332. Since the level of the high-voltage $V_p$ applied to the gate of the PMOS transistor 332 is the same as that of the high-voltage $V_p$ applied to the pad 151, the PMOS transistor 332 is turned off. This prevents a large amount of current flow across the PMOS transistor 332 that would have occurred due to the power supply voltage $V_{cc}$, and protects the PMOS transistor 332 from the high-voltage $V_p$.

The application of the high-voltage $V_p$ to the pad 151 when the power supply voltage $V_{cc}$ is applied to the gate of the PMOS transistor 335 allows the transfer of the high-voltage $V_p$ to a node $N_2$. However, since the high-voltage $V_p$ is applied to the gate of the PMOS transistor 334, the PMOS transistor 334 is turned off. As such, there is no current flow across the pad 151 due to the power supply voltage $V_{cc}$, so that the PMOS transistors 334 and 335 are protected from the high-voltage $V_p$.

Next, the protection from a high-voltage in the state where no power supply voltage $V_{cc}$ is applied to the semiconductor memory device 101 will be described. When the power supply voltage $V_{cc}$ is not applied to the semiconductor memory device, a third predetermined voltage $N_a$ of FIG. 2 is applied to the gates of the PMOS transistors 333 and 335 and the NMOS transistor 341 as an internal supply voltage $V_1$. Similar to the case where the external power voltage $V_{cc}$ is applied to the semiconductor memory device 101, a voltage level of ($V_a-V_t$) is applied to the node $N_1$ and the NMOS transistor 342 is turned off, protecting the NMOS transistors 341 and 342 from the high-voltage $V_p$. Since the high-voltage $V_p$ is applied to the gate of the PMOS transistor 332 through the PMOS transistor 333, the PMOS transistor 332 is turned off, protecting the PMOS transistors 331 and 332 from the high-voltage $V_p$.

The PMOS transistors 331 through 335 each have N-wells connected to the node $N_2$. Because of this the application of the high-voltage $V_p$ to the pad 151 allows the high-voltage $V_p$ to be applied to the node $N_2$ through the PMOS transistor 335. This prevents a leakage current between the pad 151 and the N-wells of the PMOS transistors 331 through 335, and between the pad 151 and the power supply voltage $V_{cc}$. Also, since the NMOS transistors 341 and 342 have P-wells coupled to the ground voltage, a leakage current from the pad 151 to the P-wells of the NMOS transistors 341 and 342 or to ground is also prevented.

The input buffer 141 of the high-voltage tolerant interface circuit 113 converts the voltage level of data $IN_2$ input through the pad 151 from an outside source into a voltage level appropriate for the semiconductor memory device 101. For example, the input buffer 141 may convert a signal of a TTL voltage level into a signal of a CMOS voltage level. When the output enable signal E is logic low, the input buffer 141 is activated to buffer the data $IN_2$ input from the pad 151. When the output enable signal E is logic high, the input buffer 141 is deactivated, and does not allow the buffering of the data $IN_2$.

Figure 4:
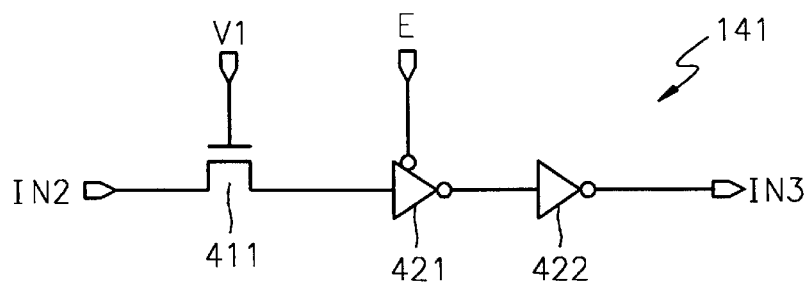
FIG. 4 is a circuit diagram of the input buffer of FIG. 1.

A circuit diagram of the input buffer 141 is shown in FIG. 4. Referring to FIG. 4, the input buffer 141 includes an NMOS transistor 411 and inverters 421 and 422. The input buffer 141 may be implemented using one of the inverters 421 and 422, and then the inverter 421 in the input buffer 141 may be directly connected to the pad 151.

"The NMOS transistor 411 is connected to the pad 151 at its drain, and to the voltage control unit 131 at its gate. Since either the power supply voltage $V_{cc}$ or the third predetermined voltage $N_a$ is applied to the gate of the NMOS transistor 411 as the internal supply voltage $V_1$, a voltage of ($V_{cc}-V_t$) or ($V_a-V_t$) occurs at the source of the NMOS transistor 411, despite the high-voltage $V_p$ applied to the pad 151. The reason for this is that the voltage ($V_{cc}-V_t$) or ($V_a-V_t$) applied to the gate of the NMOS transistor 411 saturates the NMOS transistor 411. Here, $V_{cc}$ represents the power supply voltage, $N_a$ represents the third predetermined voltage, and $V_t$ represents the threshold voltage of the NMOS transistor 411. In other words, when the external power supply voltage $V_{cc}$ is applied to the semiconductor memory device, the external power supply voltage $V_{cc}$ is applied to the gate of the NMOS transistor 411 as the internal power supply voltage $V_1$. When the high-voltage $V_p$ is applied to the pad 151, and the external power supply voltage $V_{cc}$ is not supplied to the semiconductor memory device 101, the third predetermined voltage $N_a$ is applied to the gate of the NMOS transistor 411 as the internal power supply voltage $V_1$."

As described above, whether or not the external power voltage $V_{cc}$ is applied to the semiconductor memory device 101, one of the power supply voltage $V_{cc}$ or the third predetermined voltage $N_a$ is applied to the gate of the NMOS transistor 411 as an internal power supply voltage $V_1$. As a result of this, the NMOS transistor 411 can be protected from damage caused by the application of the high-voltage $V_p$.

Also, even when the high-voltage $V_p$ is applied to the pad 151, the source of the NMOS transistor 411 is clamped at a voltage level of ($V_{cc}31\ V_t$) or ($V_a-V_t$), without causing damage to the inverters 421 and 422. In other words, the NMOS transistor 411 acts as a shield for the inverters 421 and 422. Because the NMOS transistor has its P-well coupled to ground voltage, the high-voltage $V_p$ applied to the pad 151 does not cause a leakage current from the pad 151 to the P-well of the NMOS transistor 411.

The inverter 421 of the input buffer 141 inverts the signal from the NMOS transistor 411 in response to the output enable signal E. In other words, when the output enable signal E is disabled to logic low, the inverter 421 is activated to invert the signal from the NMOS transistor 411. When the output enable signal E is enabled to logic high, the inverter 421 is turned off, which does not allow the inverting of the signal from the NMOS transistor 411.

As described above, when the output enable signal E is enabled, the output buffer 121 is activated and the input buffer 141 is deactivated. In comparison, when the output enable signal E is disabled, the output buffer 121 is deactivated and the input buffer 141 is activated.

The semiconductor memory device 101 may be implemented with a plurality of pads, a plurality of output buffers, and a plurality of input buffers.

As described above, when the high-voltage $V_p$ is applied to the semiconductor memory device 101, the output buffer 121 and the input buffer 141 can be protected from the high-voltage $V_p$ both when the external power voltage $V_{cc}$ is applied to the semiconductor memory device 101 and when the external power voltage $V_{cc}$ is not applied. Also, when the high-voltage $V_p$ of magnitude greater than the power supply voltage is applied to the semiconductor memory device, and the external power supply voltage $V_{cc}$ is not applied to the semiconductor memory device 101, the leakage current does not occur to the output buffer 121 and the input buffer 141, allowing a fail-safe function to be properly performed.

In the drawing and specification, there have been disclosed typical preferred embodiments of the invention and, although specific terms are employed, they are used in a generic and descriptive sense only and not for purposes of limitation. Rather, the scope of the invention is set forth in the following claims. While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A high-voltage tolerant interface circuit comprising:
    a terminal;
    a first buffer including a plurality of MOS transistors having first electrodes connected to the terminal, the first buffer converts a voltage level of an input signal to the first buffer and transfers the converted voltage level to the terminal;
    a second buffer including at least one MOS transistor with an electrode connected to the terminal, the second buffer converts a voltage level of a signal input at the terminal; and
    a voltage control unit connected to the terminal, that provides an internal power supply voltage to the MOS transistors of the first and second buffers,
    wherein the internal power supply voltage is equal to an external power supply voltage when the external power supply voltage is applied to the high-voltage tolerant interface circuit, and
    wherein the internal power supply voltage is equal to a predetermined voltage level when the external power supply voltage is not applied to the high-voltage tolerant interface circuit and a high-voltage greater than the external power supply voltage is input to the terminal.

2. A high-voltage tolerant interface circuit, as recited in claim 1, wherein the predetermined voltage level is higher than 2 volts.

3. A high-voltage tolerant interface circuit, as recited in claim 1, wherein the internal power supply voltage is set to the predetermined voltage level by pulling down the high-voltage input at the terminal to the predetermined voltage level.

4. A high-voltage tolerant interface circuit, as recited in claim 3, wherein the voltage control unit comprises a voltage pull-down circuit for pulling down the high-voltage to the predetermined voltage level.

5. A high-voltage tolerant interface circuit, as recited in claim 4, wherein the voltage pull-down circuit comprises a plurality of diodes arranged in series and connected with the terminal.

6. A high-voltage tolerant interface circuit, as recited in claim 4, wherein the voltage control unit further comprises:
    a switching control unit for receiving a first control signal and outputting second and third control signals, the first control signal instructing the switching control unit to enable the second control signal when the external power supply voltage is applied, and the first control signal instructing the switching control unit to enable the third control signal when the high-voltage is input to the terminal without application of the external power supply signal;
    a first switch for passing the external power supply voltage as the internal power supply voltage in response to enabling of the second control signal; and
    a second switch for passing the predetermined voltage level pulled down by the voltage pull-down circuit as the internal power supply voltage in response to enabling of the third control signal,
    wherein the voltage control unit outputs the internal power supply voltage at a node located between the first and second switches.

7. A high-voltage tolerant interface circuit, as recited in claim 1, wherein the voltage control unit comprises a voltage discharge circuit for discharging a portion of the high-voltage to reduce the high-voltage to the predetermined voltage level.

8. A high-voltage tolerant interface circuit, as recited in claim 1, wherein the high-voltage is a voltage associated with a transistor-transistor logic (TTL) level.

9. A semiconductor memory device having an internal circuit, comprising:
    a pad at which a first signal is output and a second signal is input;
    an output buffer having a plurality of MOS transistors with first electrodes connected to the pad, the output buffer converts a first voltage level of data output from the internal circuit and provides the converted first voltage level to the pad for output as the first signal;
    an input buffer having at least one MOS transistor with a first electrode connected to the pad, the input buffer converts a second voltage level of the second signal input to the pad and transfers the converted second voltage level to the internal circuit; and
    a voltage control unit connected to the pad, that provides an internal power supply voltage to the MOS transistors of the output and input buffers,
    wherein the internal power supply voltage is equal to an external power supply voltage when the external power supply voltage is applied to the semiconductor memory device, and
    wherein the internal power supply voltage is equal to a predetermined voltage level when the external power supply voltage is not applied to the semiconductor memory device and a high-voltage of magnitude greater than the external power supply voltage is input to the pad.

10. A semiconductor memory device, as recited in claim 9, wherein the internal power supply voltage is set to the predetermined voltage level by pulling down the high-voltage input to the pad.

11. A semiconductor memory device, as recited in claim 10, wherein the voltage control unit comprises a voltage pull-down circuit for pulling down the high-voltage.

12. A semiconductor memory device, as recited in claim 9, wherein the voltage control unit comprises:
    a switching control unit for receiving a first control signal and outputting second and third control signals, the first control signal instructing the switching control unit to enable the second control signal when the external power supply voltage is applied, and the first control signal instructing the switching control unit to enable the third control signal when the high-voltage is input to the pad without application of the external power supply signal;
    a first switch for passing the external power supply voltage in response to enabling of the second control signal; and a second switch for passing the predetermined voltage level in response to enabling of the third control signal, wherein the voltage control unit outputs the internal power supply voltage at a node located between the first and second switches.

13. A semiconductor memory device, as recited in claim 9, wherein the voltage control unit comprises a voltage discharge circuit for discharging a portion of the high-voltage to reduce the high-voltage to the predetermined voltage level.

14. A semiconductor memory device, as recited in claim 9, wherein the plurality of MOS transistors in the output buffer include PMOS transistors having N-wells connected to the high-voltage input to the pad.

15. A semiconductor memory device, as recited in claim 9, wherein the plurality of MOS transistors in the output buffer include an NMOS transistor having a P-well coupled to a ground voltage.

* * * * *